United States Patent
Shoji

(10) Patent No.: US 7,495,541 B2
(45) Date of Patent: Feb. 24, 2009

(54) CURRENT SENSOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 582 days.

(21) Appl. No.: 11/252,570

(22) Filed: Oct. 19, 2005

(65) Prior Publication Data

US 2006/0091993 A1   May 4, 2006

(30) Foreign Application Priority Data

Oct. 28, 2004 (JP) ............................. 2004-313539

(51) Int. Cl.
*H01L 43/00* (2006.01)
(52) U.S. Cl. .................. 338/32 R; 324/252; 324/207.21
(58) Field of Classification Search ............... 338/32 R; 324/252, 117 R, 117 H, 207.21
See application file for complete search history.

(56) References Cited

U.S. PATENT DOCUMENTS

| 5,422,571 | A | * | 6/1995 | Gurney et al. ................ 324/252 |
| 5,432,373 | A | * | 7/1995 | Johnson ....................... 257/421 |
| 5,621,377 | A | | 4/1997 | Dettmann et al. |
| 6,667,682 | B2 | * | 12/2003 | Wan et al. ................. 338/32 R |

FOREIGN PATENT DOCUMENTS

| JP | U-5-4038 | 1/1993 |
| JP | A-5-126865 | 5/1993 |
| JP | A-6-222082 | 8/1994 |
| JP | A-10-506193 | 6/1998 |

\* cited by examiner

*Primary Examiner*—Kyung Lee
(74) *Attorney, Agent, or Firm*—Oliff & Berridge, PLC

(57) ABSTRACT

The present invention provides a current sensor capable of sensing a current to be detected with high precision. The current sensor includes a bus line which extends in an X direction at a first level and to which a current to be detected is supplied, a first magnetoresistive element extending in the X direction in a region corresponding to the bus line at a second level, and a second magnetoresistive element extending in the X direction in a region corresponding to the bus line at a third level. The resistance value of the first magnetoresistive element and that of the second magnetoresistive element change in directions opposite to the second level in accordance with a current magnetic field generated by the current to be detected. With the configuration, the first and second magnetoresistive elements and the bus line can be disposed close to each other. While realizing compactness, the current magnetic field can be detected with high sensitivity.

15 Claims, 10 Drawing Sheets

CURRENT SENSOR

BACKGROUND OF THE INVENTION

1. Field of the Invention

The present invention relates to a small-size current sensor capable of sensing a change in current flowing in a conductor with high sensitivity.

2. Description of the Related Art

Generally, to accurately detect weak control current flowing in control equipment, a method of connecting resistors in series in the circuit and measuring a voltage drop in the resistors is used. In this case, however, a load different from a control system is applied and there is the possibility that an adverse influence is exerted on the control system. Consequently, a method of indirectly measuring control current by detecting the gradient of a current magnetic field generated by the control current is used. A concrete example is a method of winding a line to be measured around a toroidal core and detecting a magnetic flux generated in the center portion of the toroidal core by supplying control current to the measurement line.

With respect to a current sensor realizing the method, problems such as difficulty of realizing miniaturization and insufficient linearity or high frequency responsiveness are pointed out. To solve the problems, a current sensor in which a giant magnetoresistive element (hereinbelow, GMR element) producing giant magnetoresistive effect is disposed in the current magnetic field, and the gradient of the current magnetic field is detected has been proposed (refer to, for example, U.S. Pat. No. 5,621,377). In a current sensor using such a GMR element, detection sensitivity and responsiveness improves and detection characteristics which are stable against a temperature change are obtained.

Recently, a current sensor capable of detecting weaker current and having a more compact general configuration is being demanded. In a conventional current sensor, however, a GMR element is provided so as to be adjacent to a line to be measured in an in-plane direction, so that it is difficult to detect weak current and it is disadvantageous from the viewpoint of miniaturization.

SUMMARY OF THE INVENTION

The present invention has been achieved in consideration of such problems, and an object of the invention is to provide a current sensor capable of measuring a current to be detected with high precision while realizing a compact configuration.

A current sensor of the invention has the following components:

(a) a conductor which extends in a first direction at a first level and to which a current to be detected is supplied;

(b) a first magnetoresistive element which extends in the first direction in a region corresponding to the conductor at a second level different from the first level and whose resistance value changes according to a current magnetic field generated by a current to be detected flowing in the conductor; and (c) a second magnetoresistive element which extends in the first direction in a region corresponding to the conductor at a third level positioned on the side opposite to the second level with respect to the first level as a reference, and whose resistance value changes in a direction opposite to that in the first magnetoresistive element in accordance with the current magnetic field.

The "opposite directions" denote here that the increasing and decreasing directions of the resistance value are opposite to each other. Therefore, there is the relation such that when the resistance value of the first magnetoresistive element increases, the resistance value of the second magnetoresistive element decreases. When the resistance value of the first magnetoresistive element decreases, the resistance value of the second magnetoresistive element increases.

In the current sensor according to the invention, as compared with the case where the conductor and the first and second magnetoresistive elements are provided in the same level, the conductor and the first and second magnetoresistive elements are provided closer to each other. Consequently, the dimensions of the whole are reduced, and the current magnetic field based on the current to be detected which flows in the conductor is supplied to the first and second magnetoresistive elements more strongly.

In the current sensor of the invention, the current to be detected can be detected on the basis of a difference between voltage drops which occur when constant currents whose values are equal to each other are passed to the first and second magnetoresistive elements. Preferably, the current sensor further includes: a first compensating current line provided in a region corresponding to the first magnetoresistive element at a fourth level adjacent to the second level, and applying a compensating current magnetic field in the direction opposite to that of a current magnetic field applied to the first magnetoresistive element on the basis of the current to be detected when a compensating current according to the voltage drop difference flows, to the first magnetoresistive element; and a second compensating current line provided in a region corresponding to the second magnetoresistive element at a fifth level adjacent to the third level, and applying a compensating current magnetic field in the direction opposite to that of a current magnetic field applied to the second magnetoresistive element on the basis of the current to be detected when a compensating current according to the voltage drop difference flows, to the second magnetoresistive element. The state where the fourth level is "adjacent to the second level" denotes that the fourth level exists on the side opposite to the first level with respect to the second level as a center, or between the first and second levels. Similarly, the state where the fifth level is "adjacent to the third level" denotes that the fifth level exists on the side opposite to the first level with respect to the third level as a center or between the first and third levels.

Each of the first and second magnetoresistive elements may have a plurality of element patterns disposed so as to be adjacent to each other in a second direction orthogonal to the first direction and connected in series or a plurality of element patterns disposed so as to be adjacent to each other in a second direction orthogonal to the first direction and connected in parallel with each other. In any of the cases, preferably, the first compensating current line winds in the fourth level while including a plurality of winding body portions extending in the first direction in correspondence with the element patterns of the first magnetoresistive elements, and the second compensating current line winds in the fifth level while including a plurality of winding body portions extending in the first direction in correspondence with the element patterns of the second magnetoresistive elements.

The current sensor of the invention may further include: a third magnetoresistive element which extends in the first direction in a region corresponding to the conductor at the second level, other than the region in which the first magnetoresistive element is formed, and whose resistance value changes in the same direction as that in the first magnetoresistive element in accordance with the current magnetic field; and a fourth magnetoresistive element which extends in the first direction in a region corresponding to the conductor at the third level, other than the region in which the second magnetoresistive element is formed, and whose resistance value changes in the direction opposite to that in the first magnetoresistive element in accordance with the current magnetic field. In this case, preferably, a bridge circuit is constructed in such a manner that one end of the first magnetoresistive element and one end of the second magnetoresistive element are connected to each other at a first connection point, one end of the third magnetoresistive element and one end of the fourth magnetoresistive element are connected to each other at a second connection point, further, the other end of the first magnetoresistive element and the other end of the fourth magnetoresistive element are connected to each other at a third connection point, and the other end of the second magnetoresistive element and the other end of the third magnetoresistive element are connected to each other at a fourth connection point, and on the basis of a potential difference between the third and fourth connection points occurring when a voltage is applied across the first and second connection points, the current to be detected is detected.

Further, in the case where the third and fourth magnetoresistive elements are provided, preferably, a first compensating current line is provided in a region corresponding to both of the first and third magnetoresistive elements at the fourth level, and applies a compensating current magnetic field in the direction opposite to that of a current magnetic field applied to the first and third magnetoresistive elements on the basis of the current to be detected when a compensating current according to the potential difference flows, to the first and third magnetoresistive elements. A second compensating current line is provided in a region corresponding to both of the second and fourth magnetoresistive elements at the fifth level, and applies a compensating current magnetic field in the direction opposite to that of a current magnetic field applied to the second and fourth magnetoresistive elements on the basis of the current to be detected when a compensating current according to the potential difference flows, to the second and fourth magnetoresistive elements.

The current sensor of the invention has: the conductor extending in the first direction at the first level and to which the current to be detected is supplied; the first magnetoresistive element extending in the first direction in the area corresponding to the conductor at the second level; and the second magnetoresistive element extending in the first direction in the area corresponding to the conductor at the third level positioned on the side opposite to the second level with respect to the first level as a reference and whose resistance value changes in the direction opposite to that of the first magnetoresistive element in accordance with the current magnetic field. Consequently, while realizing compactness, the current magnetic field generated by the current to be detected can be detected with high sensitivity. Therefore, while realizing the compact configuration, a relatively weak current to be detected can be measured with high precision. Since the resistance value in the first magnetoresistive element and that in the second magnetoresistive element change in the directions opposite to each other by the current magnetic field, by detecting the difference between the resistance values, the current to be detected can be measured with high precision. In particular, by detecting the difference between voltage drops which occur when the constant currents having values equal to each other are passed to the first and second magnetoresistive elements, reliability of the result of measurement improves.

By further providing the current sensor of the present invention with: the first compensating current line provided in a region corresponding to the first magnetoresistive element at a fourth level, and applying a compensating current magnetic field in the direction opposite to that of a current magnetic field applied to the first magnetoresistive element on the basis of the current to be detected when a compensating current according to the voltage drop difference flows, to the first magnetoresistive element; and the second compensating current line provided in a region corresponding to the third magnetoresistive element at a fifth level, and applying a compensating current magnetic field in the direction opposite to that of a current magnetic field applied to the second magnetoresistive element on the basis of the current to be detected when a compensating current according to the voltage drop difference flows, to the second magnetoresistive element, an error caused by variations in the characteristics between the first and second magnetoresistive elements, variations in the connection resistance in the circuit, or a bias in the temperature distribution can be canceled. Accordingly, the current to be detected can be measured with higher precision.

In the current sensor of the invention, particularly, when each of the first and second magnetoresistive elements has a plurality of element patterns disposed so as to be adjacent to each other in the second direction orthogonal to the first direction and connected in series, without increasing the dimension in the first direction, the total length of each of the element patterns functioning as magnetosensitive parts can be obtained, and the absolute value of the whole resistance value (impedance) in each of the first and second magnetoresistive elements can be obtained. Therefore, even a weaker current to be detected can be measured with high precision. When the first compensating current line includes a plurality of winding body portions extending in the first direction in correspondence with the element patterns in the first magnetoresistive element and winds in the fourth level, and the second compensating current line includes a plurality of winding body portions extending in the first direction in correspondence with element patterns in the second magnetoresistive element, the compensating current magnetic fields Hd having uniform magnitude can be applied to each of the plurality of element patterns, and precision of measurement values of the current to be detected can be further increased.

In the current sensor of the invention, particularly, when each the first and second magnetoresistive elements has a plurality of element patterns disposed so as to be adjacent to each other in a second direction and connected in parallel with each other, while maintaining a compact configuration, the whole resistance value (impedance) can be decreased without decreasing the resistance change ratio, the influence by noise from the outside (unnecessary magnetic fields) is reduced, and the S/N ratio can be improved. In this case as well, when the first compensating current line winds in the fourth level so as to include the plurality of winding body portions extending in the first direction in correspondence with the element patterns in the first magnetoresistive element and the second compensating current line winds in the fifth level so as to include the winding body portions extending in the first direction in correspondence with the element patterns in the second magnetoresistive element, the compensating current magnetic field of a proper magnitude can be supplied to each of the plurality of element patterns, and precision of measurement values of the current to be detected can be further increased.

When the current sensor of the invention further includes: the third magnetoresistive element which extends in the first direction in a region corresponding to the conductor at the second level, other than the region in which the first magnetoresistive element is formed, and whose resistance value changes in the same direction as that in the first magnetoresistive element in accordance with the current magnetic field; and the fourth magnetoresistive element which extends in the first direction in a region corresponding to the conductor at the third level, other than the region in which the second magnetoresistive element is formed, and whose resistance value changes in the direction opposite to that in the first magnetoresistive element in accordance with the current magnetic field, a bridge circuit can be constructed by using first to fourth magnetoresistive elements. While maintaining the compact configuration, precision of measurement values of the current to be detected can be further increased.

Other and further objects, features and advantages of the invention will appear more fully from the following description.

DETAILED DESCRIPTION OF THE PREFERRED EMBODIMENTS

Embodiments of the invention will be described in detail hereinbelow with reference to the drawings.

First Embodiment

Figure 1:
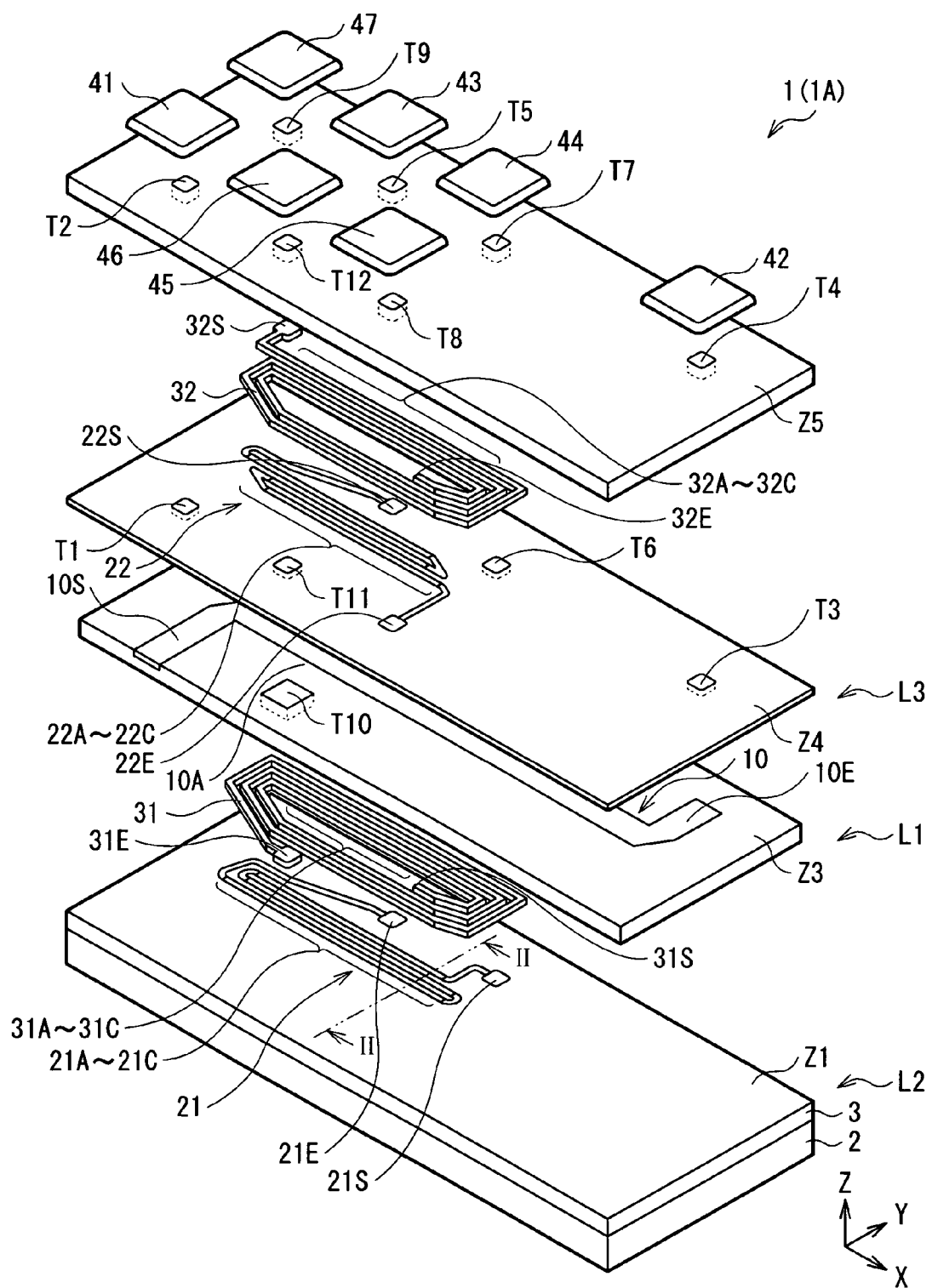
FIG. 1 is a perspective view showing the configuration of a current sensor according to a first embodiment of the invention.
Figure 2:
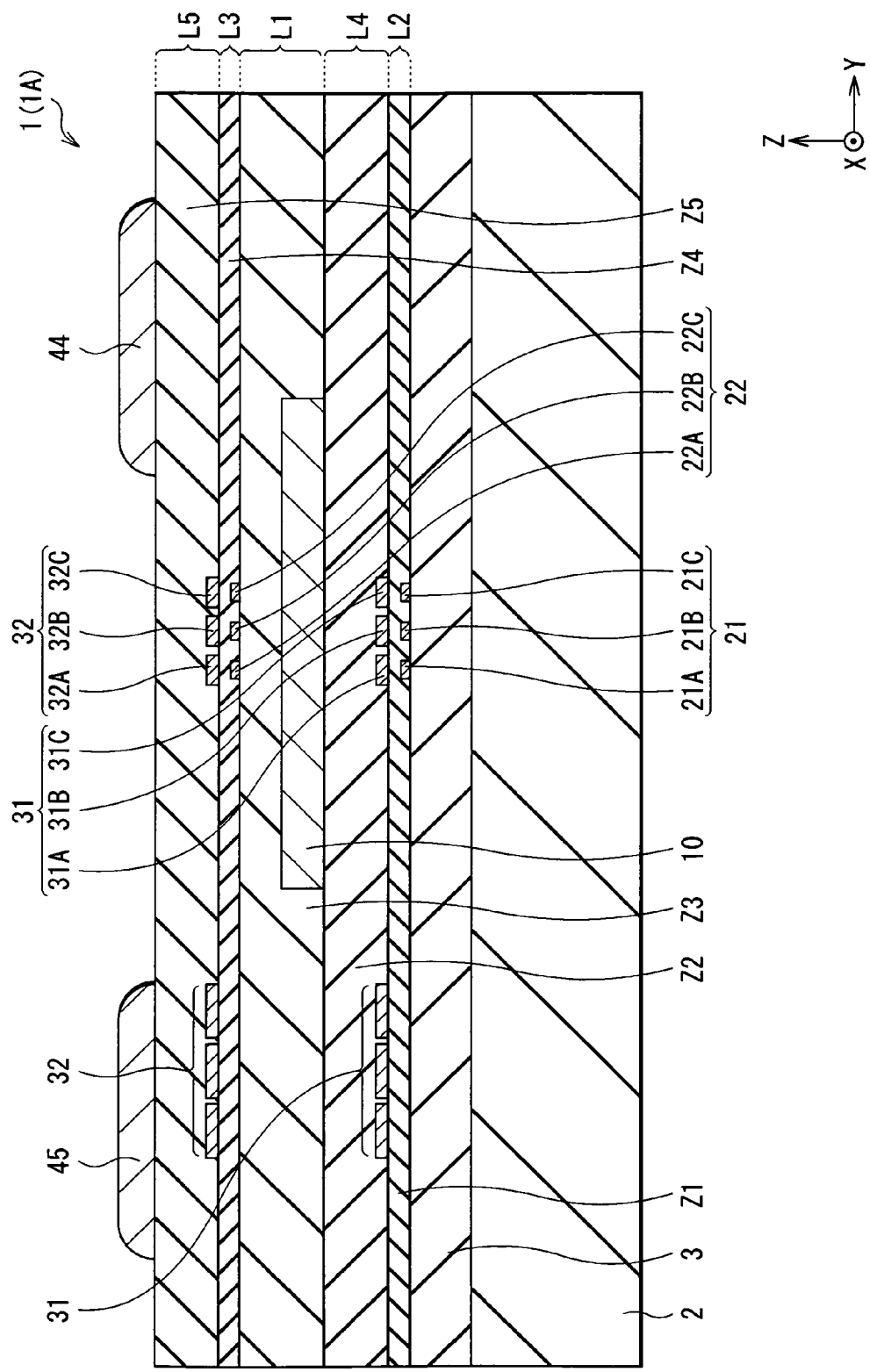
FIG. 2 is a cross section taken along line II-II of the current sensor illustrated in FIG. 1.

First, the configuration of a current sensor as a first embodiment of the invention will be described with reference to FIGS. 1 and 2. FIG. 1 is a schematic view illustrating a perspective configuration of a current sensor 1 according to the embodiment. FIG. 2 is a cross section taken along line II-II of the current sensor 1 illustrated in FIG. 1 seen from the direction indicated by the arrows (−X direction). The current sensor 1 is mounted on, for example, a controller which executes control of operation in industrial machinery, consumer appliances or the like, and is used in order to accurately measure a current as a control signal. To distinguish the current sensor of the first embodiment from that of a second embodiment to be described later, the current sensor in the first embodiment will be called a current sensor 1A.

The current sensor 1A includes a bus line 10 having a straight line portion 10A extending in a first direction (X direction) at a first level L1, a first magnetoresistive element 21 extending in the X direction at a second level L2 different from the first level L1 (hereinbelow, simply called the "magnetoresistive element 21"), and a second magnetoresistive element 22 extending in the X direction at a third level L3 positioned on the side opposite to the second level L2 with respect to the first level L1 as a reference (hereinbelow, simply called the "magnetoresistive element 22"). The bus line 10 is a thin film (film thickness of 3 µm as an example) made by plating or the like by using a metal material having high conductivity such as copper (Cu), and to which a current Im to be detected such as a control signal or the like is supplied. One end 10S of the bus line 10 is connected to an electrode film 41 via contact layers T1 and T2 and the like. The other end 10E of the bus line 10 is connected to an electrode film 42 via contact layers T3 and T4 and the like (refer to FIG. 1). The current sensor 1A is set so that the current Im to be detected flows from one end 10S to the other end 10E. Both of the magnetoresistive elements 21 and 22 detect current magnetic fields Hm (which will be described later) generated by the current Im to be detected, and are provided in areas corresponding to the straight line portion 10A of the bus line 10 in the stacking direction.

The current sensor 1A further includes a first compensating current line 31 provided so as to be formed at a fourth level L4 between the first level L1 and the second level L2 and a part of it extends in the X direction in the area corresponding to the magnetoresistive element 21 (hereinbelow simply called the "compensating current line 31"), and a second compensating current line 32 provided so as to be formed at a fifth level L5 positioned on the side opposite to the first level L1 with respect to the third level L3 as a reference and a part of which extends in the X direction in the area corresponding to the magnetoresistive element 22 (hereinbelow simply called the "compensating current line 32"). Therefore, the current sensor 1A has a configuration obtained by sequentially stacking the second level L2 including the magnetoresistive element 21 on a substrate 2 made of silicon or the like via a base film 3 made of aluminum oxide ($Al_2O_3$) or the like, the fourth level L4 including the compensating current line 31, the first level L1 including the bus line 10, the third level L3 including the magnetoresistive element 22, and the fifth level L5 including the compensating current line 32. For example, the thickness of the first level L1 is 8.2 µm, that of the second level L2 is 2 µm, and that of the fourth level L4 is 4 µm. The distance between the top surface of the magnetoresistive element 21 and the under surface of the bus line 10 is, for example, 5.2 µm. In the cross section of FIG. 2, the magnetoresistive element 21, the compensating current line 31, the bus line 10, the magnetoresistive element 22, and the compensating current line 32 are covered with insulating films Z1 to Z5 made of $Al_2O_3$ or the like, respectively, and electrically insulated from each other. However, as will be described later, in a part which is not shown in the cross section of FIG. 2, the magnetoresistive elements 21 and 22 are partially coupled to each other via a contact layer, and the compensating current lines 31 and 32 are partially coupled to each other via another contact layer. Moreover, a plurality of electrode films 41 to 47 are provided over the insulating film Z5 covering the compensating current line 32 at the fifth level L5.

The magnetoresistive element 21 has a plurality of element patterns 21A to 21C between a pair of ends 21S and 21E. The element patterns 21A to 21C are formed to have a thickness of, for example, 0.8 μm each by sputtering or the like and provided in series so as to extend in the X direction and be adjacent to each other in the Y direction (second direction) orthogonal to the X direction. Specifically, the magnetoresistive element 21 is folded in a zigzag form between the ends 21S and 21E, and the element patterns 21A to 21C are disposed in a parallel portion. Similarly, the magnetoresistive element 22 has a plurality of element patterns 22A to 22C connected in series so as to extend in the X direction and be adjacent to each other in the Y direction between the ends 22S and 22E. The ends 21E and 21S are coupled to each other via a contact layer (not shown) or the like. The end 22S is connected to an electrode film 43 via a contact layer T5 or the like. Moreover, the end 21S is connected to an electrode film 44 via contact layers T6 and T7 or the like, and the end 22E is connected to an electrode film 45 via a contact layer T8 or the like. When a constant read current is passed to each of the element patterns 21A to 21C and the element patterns 22A to 22C, a change occurs in a resistance value in accordance with current magnetic field Hm generated by the current Im to be detected flowing in the bus line 10. In the case, the direction of a change in the resistance values of the element patterns 21A to 21C and that of a change in the resistance values of the element patterns 22A to 22C are opposite to each other. Specifically, there is a relation such that when the resistance values of element patterns 21A to 21C increase, the resistance values of the element patterns 21A to 21C decrease. The detailed configurations of the element patterns 21A to 21C and 22A to 22C will be described later.

The compensating current line 31 has a pair of ends 31S and 31E and winds in the fourth level L4 so as to include winding body portions 31A to 31C extending in the X direction in correspondence with the element patterns 21A to 21C, respectively. On the other hand, the compensating current line 32 has a pair of ends 32S and 32E and winds in the fifth level L5 so as to include winding body portions 32A to 32C extending in the X direction in correspondence with the element patterns 22A to 22C. Since the ends 32E and 31S are coupled to each other via a contact layer (not shown), the compensating current lines 31 and 32 are formed as one current line in the circuit configuration. The compensating current lines 31 and 32 are formed to have a thickness of, for example, 1.2 μm by plating or the like. The end 32S is connected to an electrode film 47 via a contact layer T9, and the end 31E is connected to an electrode film 46 via contact layer T10 to T12 in order.

Figure 3:
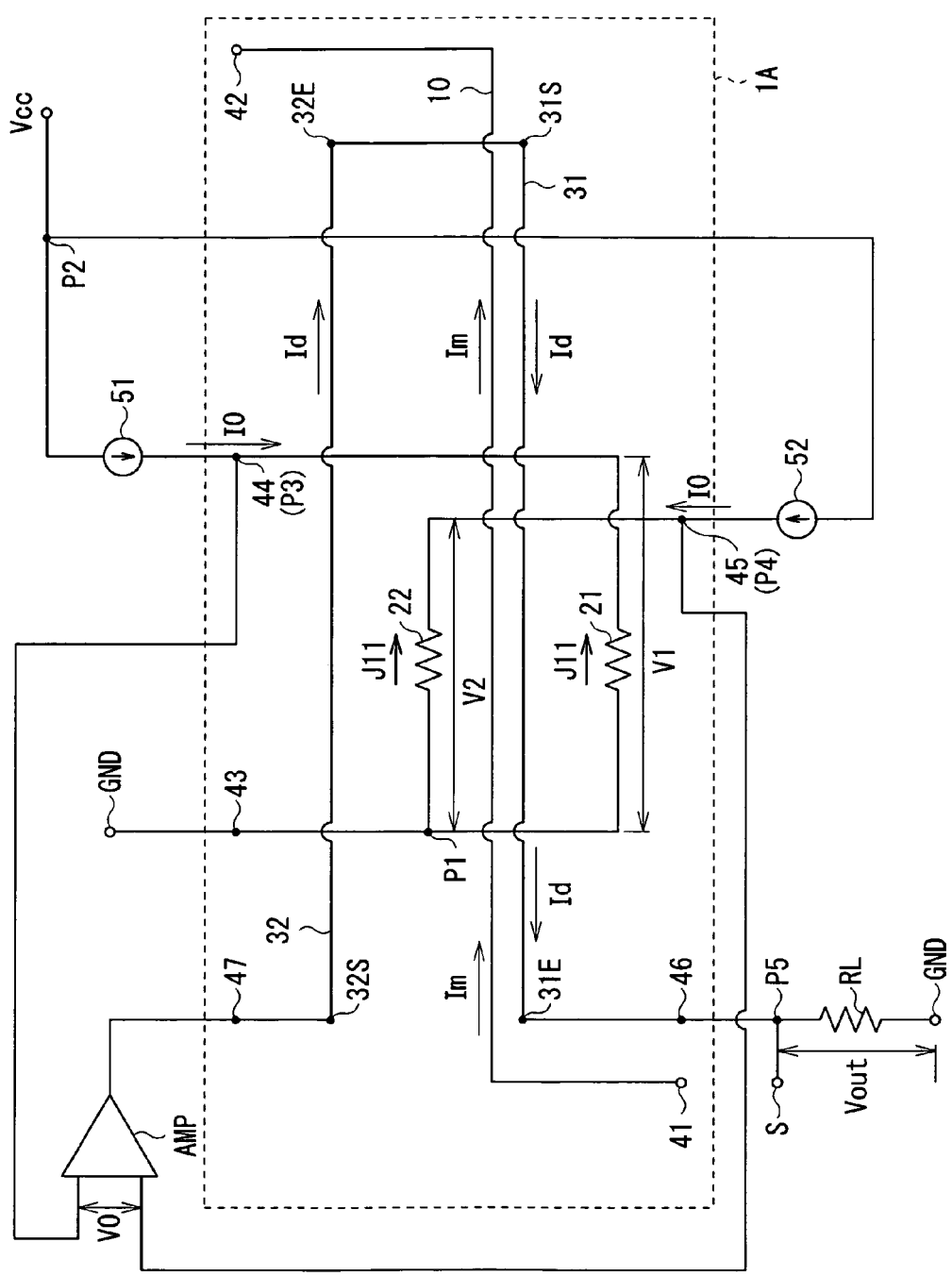
FIG. 3 is a circuit diagram of the current sensor shown in FIG. 1.

FIG. 3 is a schematic diagram illustrating a circuit configuration of an ammeter including the current sensor 1A shown in FIGS. 1 and 2. In FIG. 3, a portion surrounded by a broken line corresponds to the current sensor 1A. As shown in FIG. 3, the magnetoresistive elements 21 and 22 are provided so as to face each other while sandwiching the bus line 10 extending in the X direction (in the Z direction in reality). In the diagram, the magnetoresistive elements 21 and 22 are expressed as resistors in which a plurality of element patterns are connected in series. The end 21E of the magnetoresistive element 21 and the end 22S of the magnetoresistive element 22 are coupled to each other at a first connection point P1 and finally grounded via the electrode film 43. On the side opposite to the connection point P1 of the magnetoresistive elements 21 and 22, constant current sources 51 and 52 which are coupled to each other at a second connection point P2 are provided. Concretely, the end 21S on the side opposite to the first connection point P1 in the magnetoresistive element 21 is connected to the constant current source 51 via the electrode film 44 as a third connection point P3. The end 22E on the side opposite to the first connection point P1 in the magnetoresistive element 22 is connected to the constant current source 52 via the electrode film 45 as a fourth connection point P4. The constant current sources 51 and 52 supply constant currents I0 whose values are equal to each other to the magnetoresistive elements 21 and 22, respectively.

When the constant currents I0 are passed to the magnetoresistive elements 21 and 22 by the constant current sources 51 and 52, a compensating current Id based on a potential difference between the electrode films 44 and 45 (the difference between a voltage drop in the magnetoresistive element 21 and a voltage drop in the magnetoresistive element 22) is supplied to the compensating current lines 31 and 32. The electrode films 44 and 45 are connected to the input side of a differential amplifier AMP which is provided on the outside. The output side of the differential amplifier AMP is connected to the end 32S of the compensating current line 32 via the electrode film 47. The end 31E on the side opposite to the compensating current line 31 having the end 31S connected to an end 32E of the compensating current line 32 is connected to an external resistor RL via the electrode film 46 and a fifth connection point P5 and is finally grounded. On the side of the differential amplifier AMP of the resistor RL, compensating current detecting means S connected at the connection point P5 is provided. In this configuration, when the compensating current Id flows to the compensating current line 31, a compensating current magnetic field Hd in the direction opposite to that of a current magnetic field Hm applied to the magnetoresistive element 21 on the basis of the current Im to be detected is applied to the magnetoresistive element 21. Similarly, when the compensating current Id flows to the compensating current line 32, the compensating current magnetic field Hd in the direction opposite to that of the current magnetic field Hm applied to the magnetoresistive element 22 on the basis of the current Im to be detected is applied to the magnetoresistive element 22. This will be now described in detail with reference to FIG. 4.

Figure 4:
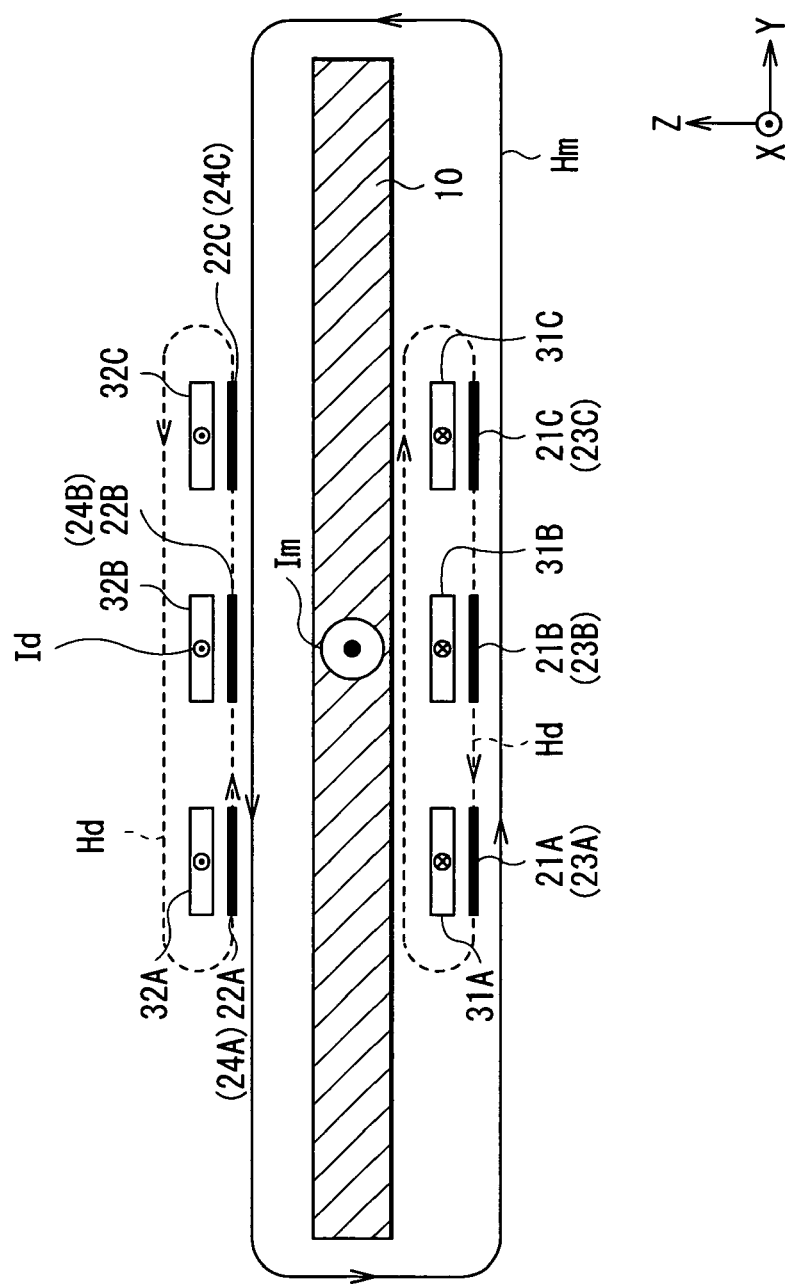
FIG. 4 is an enlarged cross section of a main part of the current sensor shown in FIG. 2.

FIG. 4 is an enlarged view of a main portion of the sectional configuration shown in FIG. 2 and schematically shows the relation between current flow directions and the directions of magnetic fields generated by the currents. When the current Im to be detected is supplied to the bus line 10, for example, toward the +X direction (from the back to this side in the diagram), the current magnetic field Hm in a counterclockwise direction in the diagram is generated according to the right-handed screw rule. Consequently, the current magnetic field Hm in the +Y direction is applied to each of element patterns 21A to 21C in the magnetoresistive element 21, and the current magnetic field Hm in the −Y direction is applied to the element patterns 22A to 22C in the magnetoresistive element 22. At this time, the compensating current Id flows in the winding body portions 31A to 31C corresponding to the element patterns 21A to 21C in the −X direction (from this side to the back in the diagram), and flows in the winding body portions 32A to 32C corresponding to the element patterns 22A to 22C in the +X direction. Therefore, according to the right-handed screw rule, the compensating current magnetic field Hd which is in the clockwise direction in the diagram is generated around the winding body portions 31A to 31C, and the compensating current magnetic field Hd which is in the counterclockwise direction in the diagram is generated around the winding body portions 32A to 32C. As a result, the compensating current magnetic field Hd in the −Y direction is applied to each of the element patterns 21A to 21C. The compensating current magnetic field Hd in the +Y direction is applied to each of the element patterns 22A to 22C. That is, the compensating current magnetic field Hd in the direction opposite to that of the current magnetic field Hm is applied to each of the element patterns 21A to 21C and the element patterns 22A to 22C.

Figure 5:
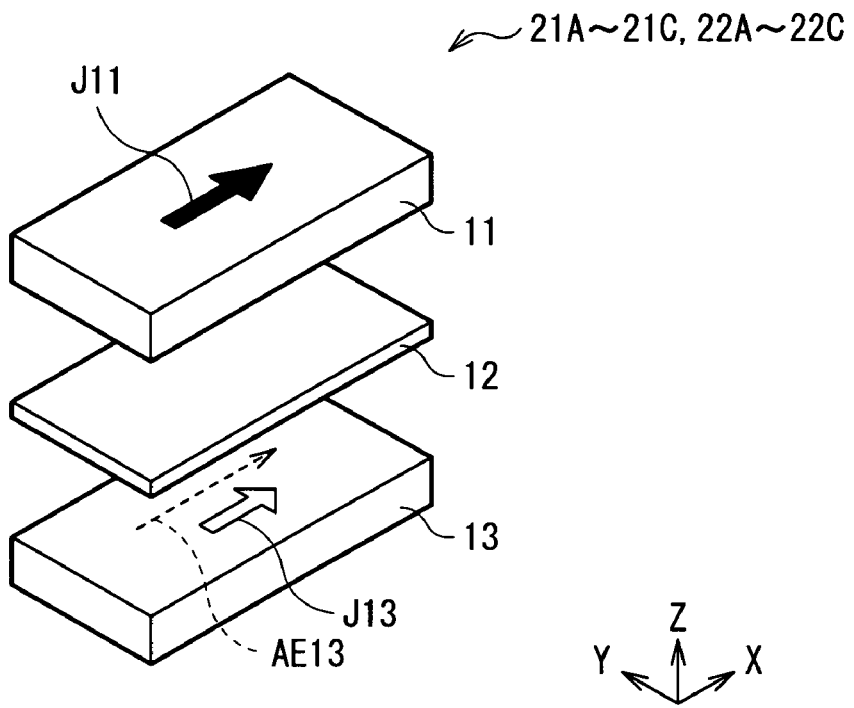
FIG. 5 is an exploded perspective view showing the configuration of an element pattern as a main part of the current sensor illustrated in FIG. 1.

Next, the configuration of the element patterns 21A to 21C and the element patterns 22A to 22C will be described in detail with reference to FIG. 5. FIG. 5 is an exploded perspective view showing the configuration of each of the element patterns 21A to 21C and the element patterns 22A to 22C.

As shown in FIG. 5, each of the element patterns 21A to 21C and the element patterns 22A to 22C has a spin valve structure in which a plurality of function films including magnetic layers are stacked. Each of the element patterns 21A to 21C and the element patterns 22A to 22C includes a pinned layer 11 having a magnetization direction J11 pinned in the +X direction, a free layer 13 whose magnetization direction J13 changes according to external magnetic fields H such as the current magnetic field Hm, and an intermediate layer 12 which is sandwiched between the pinned layer 11 and the free layer 13 and does not show any specific magnetization direction. The free layer 13 is made of a soft magnetic material such as nickel iron alloy (NiFe). The intermediate layer 12 is made of copper (Cu), whose top face is in contact with the pinned layer 11 and whose under face is in contact with the free layer 13. The intermediate layer 12 can be made of, other than copper, a nonmagnetic metal having high conductivity such as gold (Au). Each of the top face of the pinned layer 11 (the face on the side opposite to the intermediate layer 12) and the under face of the free layer 13 (the face on the side opposite to the intermediate layer 12) is protected with a not-shown protection film. Exchange bias magnetic fields Hin in the magnetization direction J11 (hereinbelow, simply called "exchange bias magnetic fields Hin") are generated between the pinned layer 11 and the free layer 13 and act each other via the intermediate layer 12. The strength of the exchange bias magnetic field Hin changes as the spin direction in the free layer 13 rotates according to the interval between the pinned layer 11 and the free layer 13 (that is, the thickness of the intermediate layer 12). Although FIG. 5 shows a configuration example of the case where the free layer 13, the intermediate layer 12, and the pinned layer 11 are stacked in order from the bottom, the invention is not limited to the configuration. The layers may be stacked in the opposite order.

Figure 6:
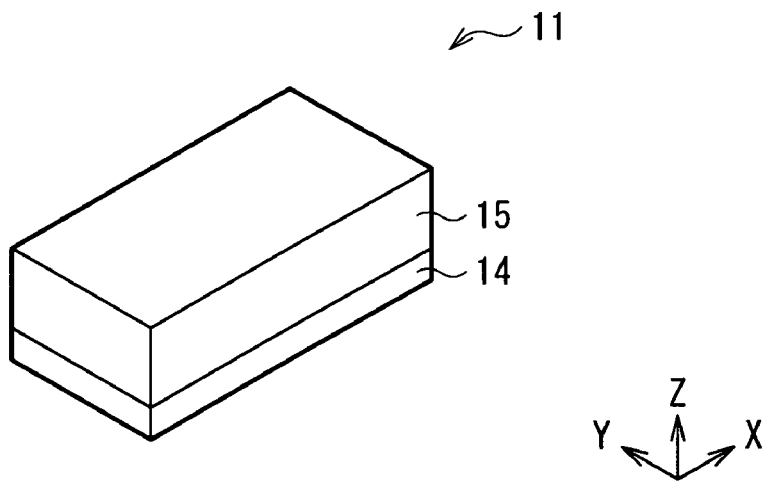
FIG. 6 is a perspective view showing the configuration of a part of the element pattern illustrated in FIG. 5.

FIG. 6 shows a detailed configuration of the pinned layer 11. The pinned layer 11 has a configuration in which a magnetization pinned film 14 and an antiferromagnetic film 15 are stacked in order from the side of the intermediate layer 12. The magnetization pinned film 14 is made of a ferromagnetic material such as cobalt (Co) or cobalt iron alloy (CoFe). The magnetization direction of the magnetization pinned film 14 is the magnetization direction J11 of the pinned layer 11 as a whole. The antiferromagnetic film 15 is made of an antiferromagnetic material such as platinum manganese alloy (PtMn) or iridium manganese alloy (IrMn). The antiferromagnetic film 15 is in the state where the spin magnetic moment in the +X direction and that in the opposite direction (−X direction) completely cancel out each other, and functions so as to pin the magnetization direction J11 of the magnetization pinned film 14.

In the element patterns 21A to 21C and the element patterns 22A to 22C constructed as described above, the magnetization direction J13 of the free layer 13 rotates by application of the current magnetic field Hm, thereby changing a relative angle between the magnetization directions J13 and J11. The relative angle is determined according to the magnitude and direction of the current magnetic field Hm.

Figure 7:
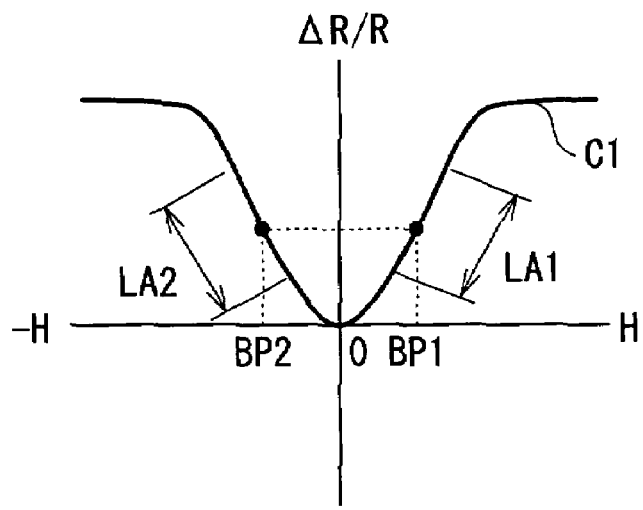
FIG. 7 is a characteristic diagram showing magnetic field dependency of a resistance change ratio in the element pattern illustrated in FIG. 5.

FIG. 5 shows a no load state where the current magnetic field Hm is zero (Hm=0) and the other magnetic fields (such as the bias magnetic field) are not applied (that is, the state where the external magnetic field H is zero). Since an easy magnetization axis direction AE13 of the free layer 13 is set so as to be parallel with the magnetization direction J11 of the pinned layer 11, all of the easy magnetization axis direction AE13 and the magnetization directions J13 and J11 are parallel with each other along the +X direction in this state. Consequently, the spin directions of magnetic domains in the free layer 13 align in almost the same direction. In the case where the external magnetic field H is applied to the element patterns 21A to 21C and the element patterns 22A to 22C in the direction orthogonal to the magnetization direction J11 (+Y direction or −Y direction), characteristics shown in FIG. 7 are obtained. FIG. 7 shows the relation between the external magnetic field H and the resistance change ratio ΔR/R when the external magnetic field H in the +Y direction is assumed to be positive. The relation is the smallest (ΔR/R=0) when the external magnetic field H is zero (H=0), and is expressed by a curve Cl which hardly shows hysteresis. In this case, 1/f noise caused by hysteresis is extremely small, so that high-sensitive and stable sensing can be performed.

Figure 8:
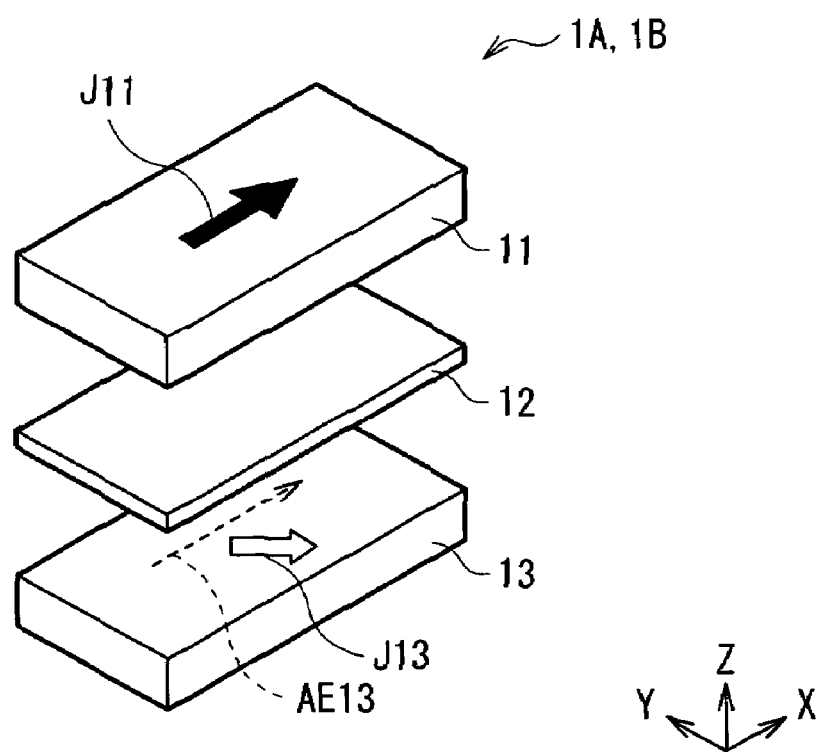
FIG. 8 is another exploded perspective view showing the configuration of the element pattern as a main part of the current sensor illustrated in FIG. 1.

As is evident from FIG. 7, however, a linear change cannot be obtained in a range around zero of the external magnetic field H (H=0). Therefore, in the case of measuring the current magnetic field Hm actually, by applying a bias magnetic field generated by a not-shown permanent magnet in a direction orthogonal to the magnetization direction J11, as shown in FIG. 8, the magnetization direction J13 is turned to be slightly tilted so as to include a component in the +Y direction or a component in the −Y direction (FIG. 6 shows the case where the magnetization direction J13 is tilted to the −Y direction). In such a manner, a change in the current magnetic field Hm can be detected with high precision in linear areas LA1 and LA2 having bias points BP1 and BP2 as center points, respectively, shown in FIG. 7. In the current sensor 1A, since the magnetization directions J11 in the pinned layer 11 is pinned in the +X direction, the bias magnetic fields in the same direction are applied to all of the element patterns 21A to 21C and the element patterns 22A to 22C. Consequently, when the current magnetic field Hm is detected, the resistance value R1 of the magnetoresistive element 21 and the resistance value R2 of the magnetoresistive element 22 change in directions opposite to each other. For example, a bias magnetic field having strength corresponding to the bias point BP1 (refer to FIG. 7) is preliminarily applied in the +Y direction to the element patterns 21A to 21C and the element patterns 22A to 22C. When the current Im to be detected is passed in the +X direction as shown in FIG. 4, the current magnetic field Hm in the +Y direction is applied to the element patterns 21A to 21C. Consequently, as is evident from FIG. 7, the resistance change ratio increases (the resistance value R1 increases). On the other hand, the current magnetic field Hm in the −Y direction is applied to the element patterns 22A to 22C. Consequently, as is obvious from FIG. 7, the resistance change ratio decreases (the resistance value R2 decreases).

In the current sensor 1A having such a configuration, when voltage is applied across the first and second connection points P1 and P2, the compensating current Id based on the difference V0 between the potentials at the third and fourth connection points P3 and P4 (the difference between voltage drops that occur in the magnetoresistive elements 21 and 22) flows in the compensating current lines 31 and 32 via the differential amplifier AMP. The compensating current Id is detected by the compensating current detecting means S. The differential amplifier AMP adjusts the compensating current Id so that the difference V0 becomes zero.

A method of measuring the current magnetic field Hm generated by the current Im to be detected will be described hereinbelow by referring again to FIG. 3.

In FIG. 3, constant currents from the constant current sources 51 and 52 when a predetermined voltage is applied across the first and second connection points P1 and P2 are expressed as I0, and the resistance values of the magnetoresistive elements 21 and 22 are expressed as R1 and R2, respectively. In the case where no current magnetic field Hm is applied, a potential V1 at the third connection point P3 (the electrode film 44) is expressed as follows.

$$V1 = I0 \cdot R1$$

A potential V2 at the fourth connection point P4 (the electrode film 45) is expressed as follows.

$$V2 = I0 \cdot R2$$

Therefore, the potential difference between the third and fourth connection points P3 and P4 is expressed by the following equation.

$$V0 = V1 - V2 \qquad (1)$$
$$= I0 \cdot R1 - I0 \cdot R2$$
$$= I0 \cdot (R1 - R2)$$

In this circuit, by measuring the potential difference V0 when the current magnetic field Hm is applied, the resistance change amount in the magnetoresistive elements 21 and 22 is obtained. For example, it is assumed that when the current magnetic field Hm is applied, the resistance values R1 and R2 increase only by change amounts ΔR1 and ΔR2, respectively, Equation (1) is calculated as follows.

$$V0 = V1 - V2 \qquad (2)$$
$$= I0 \cdot (R1 - R2)$$
$$= I0 \cdot \{(R1 + \Delta R1) - (R2 + \Delta R2)\}$$

As already described above, the magnetoresistive element 21 (the element patterns 21A to 21C) and the magnetoresistive element 22 (the element patterns 22A to 22C) are disposed so that the resistance values R1 and R2 change in directions opposite to each other in accordance with the current magnetic field Hm. Accordingly, the positive and negative signs of the change amounts ΔR1 and ΔR2 are opposite to each other. Therefore, in Equation (2), while the resistance values R1 and R2 before application of the current magnetic fields Hm cancel out each other, the change amounts ΔR1 and ΔR2 are maintained as they are.

When it is assumed that the magnetoresistive elements 21 and 22 have the same characteristics, that is, R1=R2=R and

ΔR1=−ΔR2=ΔR,

Equation (3) is calculated as follows.

$$V0 = I0 \cdot (R1 + \Delta R1 - R2 - \Delta R2) \qquad (4)$$
$$= I0 \cdot (R + \Delta R - R + \Delta R)$$
$$= I0 \cdot (2\Delta R)$$

Therefore, by using the magnetoresistive elements 21 and 22 whose relation between an external magnetic field and a resistance change amount is grasped in advance, the magnitude of the current magnetic field Hm can be measured, and the magnitude of the current Im to be detected which generates the current magnetic field Hm of the same magnitude can be estimated. In this case, sensing is performed by using the two magnetoresistive elements 21 and 22, so that the resistance change amount which is twice as large as that in the case of performing sensing using the magnetoresistive element 21 or 22 singly can be obtained. Thus, the invention is advantageous with respect to higher precision of a measurement value.

Further, in the current sensor 1A, both of the potential V1 detected at the third connection point P3 and the potential V2 detected at the fourth connection point P4 are supplied to the differential amplifier AMP, and the compensating current Id by which the difference (the potential difference V0) becomes zero is output. The compensating current Id from the differential amplifier AMP makes the compensating current magnetic fields Hd in the direction opposite to that of the current magnetic field Hm passed to each of the element patterns 21A to 21C and the element patterns 22A to 22C, and acts so as to cancel an error amount caused by variations in the connection resistance in the circuit, variations in the characteristics between the magnetoresistive elements 21 and 22, bias in the temperature distribution, an interference magnetic field from the outside, or the like. As a result, the magnitude of the compensating current Id becomes proportional only to the current magnetic field Hm. Therefore, the compensating current detecting means S can compute the current magnetic field Hm more accurately by measuring the output voltage Vout and calculating the compensating current Id from the relation with the known resistor RL and, accordingly, can estimate the magnitude of the current Im to be detected with high precision.

As described above, the current sensor 1A of the embodiment has: the bus line 10 extending in the X direction at the first level L1 and to which the current Im to be detected is supplied; the magnetoresistive element 21 extending in the X direction in the area corresponding to the bus line 10 at the second level L2 and including the element patterns 21A to 21C in which the resistance value R1 changes according to the current magnetic field Hm; and the magnetoresistive element 22 extending in the X direction in the area corresponding to the bus line 10 at the third level L3 and including the element patterns 22A to 22C in which the resistance value R2 changes according to the current magnetic field Hm. Consequently, the magnetoresistive elements 21 and 22 can be disposed relatively near the bus line 10 and, while realizing compactness, the current magnetic field Hm can be detected with high sensitivity. Further, since the resistance values R1 and R2 change (increase or decrease) in the directions opposite to each other by the current magnetic field Hm, by detecting the difference between the resistance values, the current to be detected can be measured with high precision. In particular, since the difference V0 between voltage drops which occur when the constant currents I0 having values equal to each other are passed to the magnetoresistive elements 21 and 22 is detected, reliability of the result of measurement improves.

Further, the compensating current lines 31 and 32 are disposed at the fourth and fifth levels L4 and L5, respectively, and the compensating currents Id according to the difference V0 between voltage drops are passed to the compensating current lines 31 and 32. Therefore, the compensating current magnetic fields Hd in the direction opposite to that of the current magnetic field Hm can be passed to the element patterns 21A to 21C and the element patterns 22A to 22C, an error caused by variations in the characteristics between magnetoresistive elements 21 and 22, variations in the connection resistance in the circuit, or a bias in the temperature distribution can be canceled. Accordingly, the current Im to be detected can be measured with higher precision.

Further, the magnetoresistive elements 21A to 21C and the magnetoresistive elements 22A to 22C are connected in series so as to extend in the X direction and be adjacent to each other in the Y direction. Consequently, without increasing the dimension in the X direction, the total length of each of the magnetoresistive elements 21A to 21C and the magnetoresistive elements 22A to 22C functioning as magnetosensitive parts can be obtained. Therefore, the absolute value of the total impedance in each of the magnetoresistive elements 21 and 22 can be obtained. As a result, even a weaker current Im to be detected can be measured with high precision. In the embodiment, the current sensor 1A is constructed so that the compensating current line 31 has the winding body portions 31A to 31C corresponding to the element patterns 21A to 21C, respectively, and the compensating current line 32 has the winding body portions 32A to 32C corresponding to the element patterns 22A to 22C, respectively. Therefore, the compensating current magnetic fields Hd having uniform magnitude can be applied to the element patterns 21A to 21C and the element patterns 22A to 22C, and precision of measurement values of the current Im to be detected can be further increased.

Second Embodiment

A current sensor 1B as a second embodiment of the invention will be described with reference to FIGS. 9 and 10.

The current sensor 1B is obtained by adding third and fourth magnetoresistive elements 23 and 24 (hereinbelow, simply called "magnetoresistive elements 23 and 24) to the configuration of the current sensor 1A of the first embodiment. It will be concretely described hereinbelow but description of parts overlapping with those of the first embodiment will not be repeated.

Figure 9:
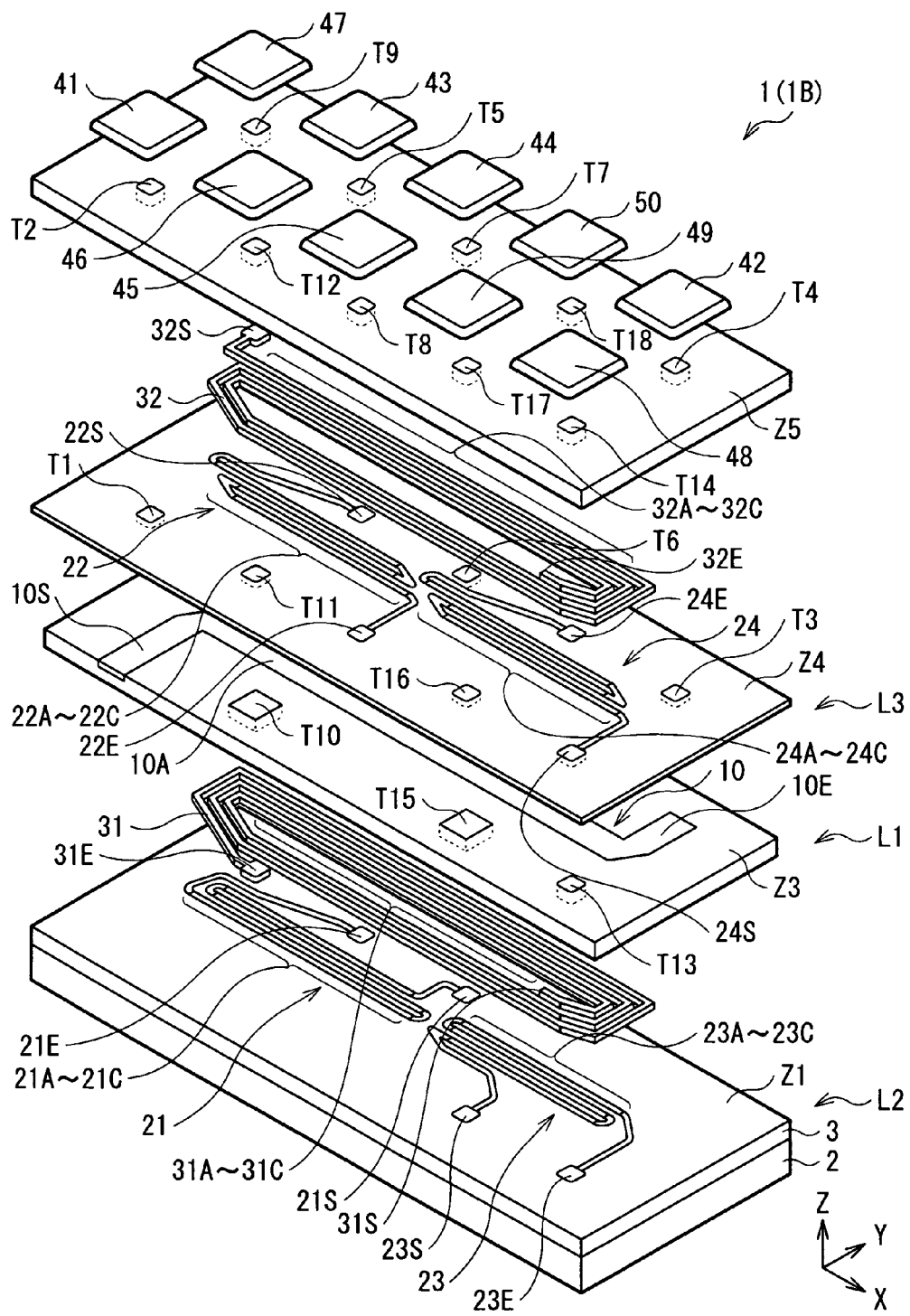
FIG. 9 is a perspective view showing the configuration of a current sensor according to a second embodiment of the invention.

FIG. 9 is a schematic view showing a perspective configuration of the current sensor 1B. As shown in FIG. 9, in the current sensor 1B, the magnetoresistive element 23 is disposed so as to be adjacent to the magnetoresistive element 21 in the X direction at the second level L2, and the magnetoresistive element 24 is disposed so as to be adjacent to the magnetoresistive element 22 in the X direction at the third level L3. The magnetoresistive element 23 includes a plurality of element patterns 23A to 23C extending in the X direction in a region corresponding to the bus line 10 in the stacking direction other than the region in which the magnetoresistive element 21 is formed. Similarly, the magnetoresistive element 24 includes a plurality of element patterns 24A to 24C extending in the X direction in a region corresponding to the bus line 10 in the stacking direction other than the region in which the magnetoresistive element 22 is formed. A resistance value R3 of the element patterns 23A to 23C as the whole magnetoresistive element 23 changes in the same direction as the resistance value R1 of the whole magnetoresistive element 21 in accordance with the current magnetic field Hm. On the other hand, a resistance value R4 of the element patterns 24A to 24C as the whole magnetoresistive element 24 changes in the same direction as the resistance value R2 of the whole magnetoresistive element 22 in accordance with the current magnetic field Hm.

The element patterns 23A to 23C extend in the X direction and are connected in series so as to be adjacent to each other in the Y direction. Specifically, the magnetoresistive element 23 is folded in a zigzag form between the ends 23S and 23E, and the element patterns 23A to 23C are disposed in a parallel portion. Similarly, the magnetoresistive element 24 is also folded in a zigzag form between the ends 24S and 24E and has the element patterns 24A to 24C in the parallel portion. The element patterns 23A to 23C are disposed on the same straight lines extending in the X direction as those of the element patterns 21A to 21C, and the element patterns 24A to 24C are disposed on the same straight lines extending in the X direction as those of the element patterns 22A to 22C. The ends 23E and 24S are coupled to each other via the contact layer 13 or the like. The end 24S is connected to an electrode film 48 on an insulating film Z5 via a contact layer T14 or the like. Further, the end 23S is connected to an electrode film 49 on the insulating film Z5 via contact layers T15 to T17 or the like, and the end 24E is connected to an electrode film 50 on the insulating film Z5 via a contact layer T18 or the like.

In the current sensor 1B, the compensating current line 31 includes the winding body portions 31A to 31C extending in the X direction in correspondence with the element patterns 21A to 21C and the element patterns 23A to 23C, and winds in the fourth level L4. Further, the compensating current line 32 includes the winding body portions 32A to 32C extending in the X direction in correspondence with the element patterns 22A to 22C and the element patterns 24A to 24C and winds in the fifth level L5. Since the ends 32E and 31S are coupled to each other via a contact layer (not shown), the compensating current lines 31 and 32 are formed as one current line in the circuit configuration. The end 32S is connected to the electrode film 47 via the contact layer T9, and the end 31E is connected to the electrode film 46 via the contact layer T10 to T12 in order.

Figure 10:
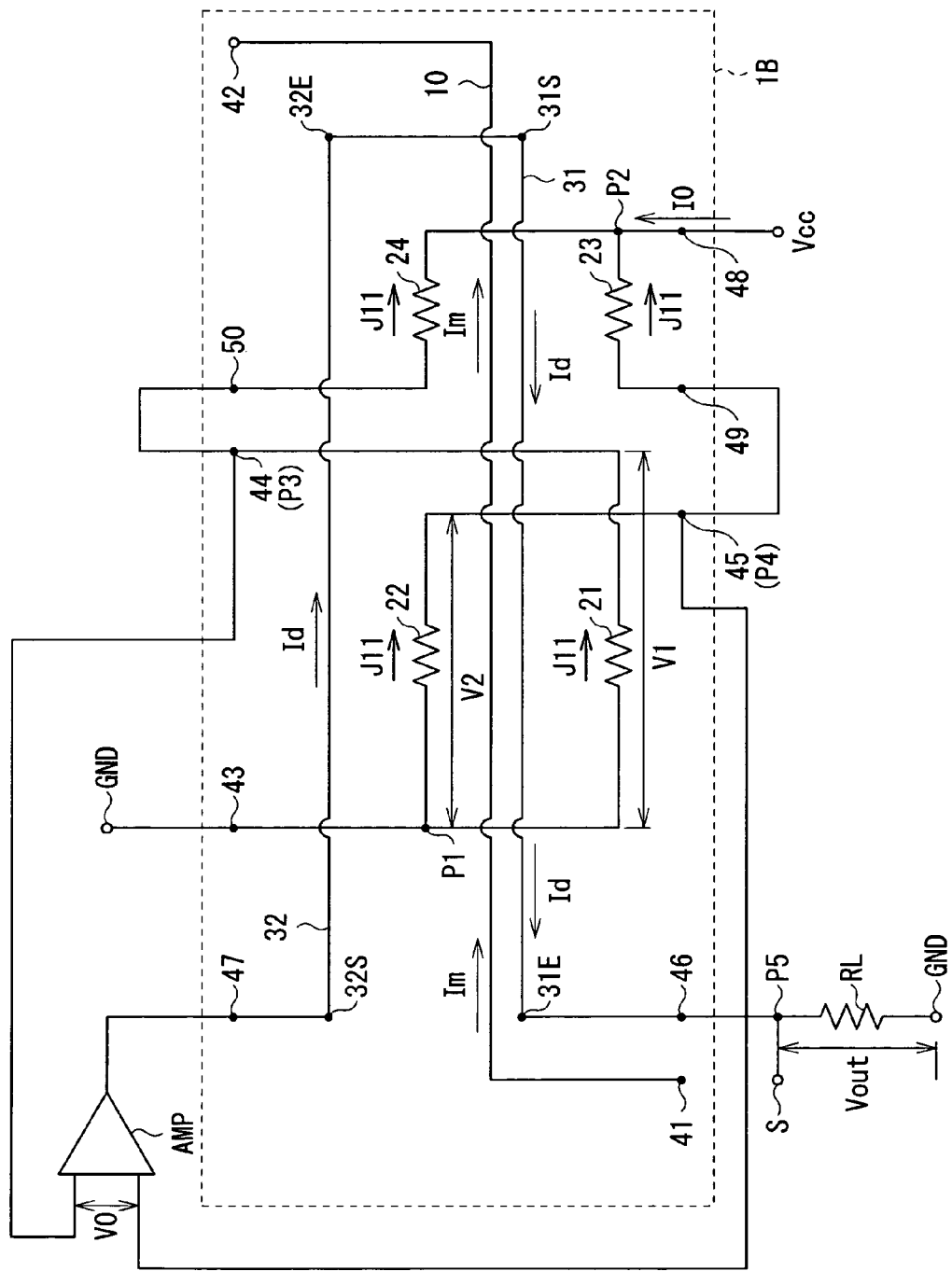
FIG. 10 is a circuit diagram of the current sensor illustrated in FIG. 9.

FIG. 10 is a schematic diagram illustrating a circuit configuration of an ammeter including the current sensor 1B shown in FIG. 9. In FIG. 10, a portion surrounded by a broken line corresponds to the current sensor 1B. As shown in FIG. 10, the magnetoresistive elements 21 and 22 are coupled to each other at the first connection point P1 and is finally grounded via the electrode film 43. The magnetoresistive elements 23 and 24 are connected to each other at the second point P2. Further, the end 21S on the side opposite to the first connection point P1 in the magnetoresistive element 21 and the end 24E on the side opposite to the second connection point P2 in the magnetoresistive element 24 are connected to each other via the electrode film 44 as the third connection point P3. The end 22E on the side opposite to the first connection point P1 in the magnetoresistive element 22 and the end 23S on the side opposite to the second connection point P2 in the magnetoresistive element 23 are connected to each other via the electrode film 45 as the fourth connection point P4. In such a manner, a bridge circuit is constructed so as to detect the current Im to be detected on the basis of the potential difference V0 between the third and fourth connection points P3 and P4 when voltage is applied across the first and second connection points P1 and P2.

When the read current I0 flows in the magnetoresistive elements 21 to 24, the compensating current Id based on the potential difference between the third and fourth connection points P3 and P4 is supplied to the compensating current lines 31 and 32. When the compensating current Id flows to the compensating current line 31, the compensating current magnetic field Hd in the direction opposite to that of the current magnetic field Hm applied to the magnetoresistive elements 21 and 23 on the basis of the current Im to be detected is applied to the magnetoresistive element 21 and 23. Similarly, when the compensating current Id flows to the compensating current line 32, the compensating current magnetic field Hd in the direction opposite to that of the current magnetic field Hm applied to the magnetoresistive elements 22 and 24 on the basis of the current Im to be detected is applied to the magnetoresistive elements 22 and 24 (refer to FIG. 4).

Figure 11:
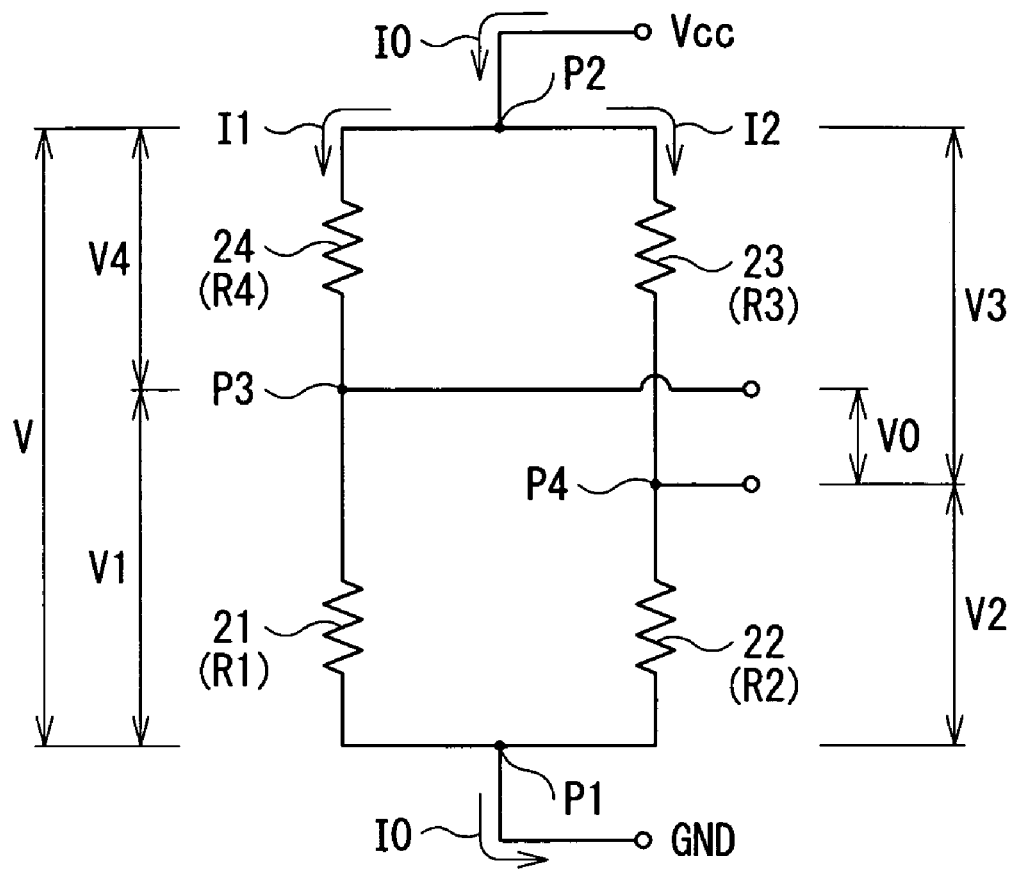
FIG. 11 is an enlarged view of a main part of the circuit diagram illustrated in FIG. 10.

In the current sensor 1B having such a configuration, by detecting the compensating current Id by the compensating current detecting means S, the current Im to be detected is estimated. By referring to FIG. 11 in addition to FIG. 10, a method of measuring the current magnetic field Hm generated by the current Im to be detected will be described. FIG. 11 is a schematic circuit diagram showing the main part of FIG. 10.

In FIG. 11, resistance values of the magnetoresistive elements 21 to 24 when the read current I0 is passed in a state where the current magnetic field Hm is not applied are expressed by reference numerals R1 to R4, respectively. The read current I0 is branched at the second connection point P2. After that read current I1 passing through the magnetoresistive elements 24 and 21 and read current I2 passing through the magnetoresistive elements 23 and 21 are merged at the first connection point P1. In this case, the potential difference V between the second and first connection points P2 and P1 can be expressed as follows.

$$V = I1 \cdot R4 + I1 \cdot R1 = I2 \cdot R3 + I2 \cdot R2 = I1(R4+R1) = I2(R3+R2) \quad (5)$$

The potential V1 at the third connection point P3 and the potential V2 at the fourth connection point P4 can be expressed as follows.

$$V1 = V - V4$$
$$= V - I1 \cdot R4$$
$$V2 = V - V3$$
$$= V - I2 \cdot R3$$

Therefore, the potential difference V0 between the third and fourth connection points P3 and P4 is obtained.

$$V0 = V1 - V2 \quad (6)$$
$$= (V - I1 \cdot R4) - (V - I2 \cdot R3)$$
$$= I2 \cdot R3 - I1 \cdot R4$$

From the equation (5), the following can be computed.

$$V0 = R3/(R3+R2) \cdot V - R4/(R4+R1) \cdot V \quad (7)$$
$$= \{R3/(R3+R2) - R4/(R4+R1)\} \cdot V$$

In the bridge circuit, by measuring the voltage V0 between the third and fourth connection points P3 and P4 expressed by the equation (7) when the current magnetic field Hm is applied, a resistance change ratio is obtained. When it is assumed that the resistance values R1 to R4 increase by change amounts $\Delta R1$ to $\Delta R4$, respectively, that is, the resistance values R1 to R4 change as follows, $$R1 \rightarrow R1 + \Delta R1$$
$$R2 \rightarrow R2 + \Delta R2$$
$$R3 \rightarrow R3 + \Delta R3$$
$$R4 \rightarrow R4 + \Delta R4$$

the voltage difference V0 after application of the current magnetic field Hm becomes as follows on the basis of the equation (7).

$$V0 = \{(R3+\Delta R3)/(R3+\Delta R3+R2+\Delta R2) - (R4+\Delta R4)/(R4+\Delta R4+R1+\Delta R1)\} \cdot V \quad (8)$$

As already described, in the current sensor 1B, the resistance values R1 and R3 of the magnetoresistive elements 21 and 23 and the resistance values R2 and R4 of the magnetoresistive elements 22 and 24 change in opposite directions (the current magnetic field Hm applied in the magnetoresistive elements 21 and 23 and that applied in the magnetoresistive elements 22 and 24 are opposite to each other, bias magnetic field in the same direction is applied in advance to all of the magnetoresistive elements 21 to 24). Consequently, the change amounts $\Delta R3$ and $\Delta R2$ cancel out each other, and the change amounts $\Delta R4$ and $\Delta R1$ cancel out each other. Consequently, when the state after application of the current magnetic field Hm is compared with that before the application, the denominators in the terms of the equation (8) hardly increase. On the other hand, since the change amounts $\Delta R3$ and $\Delta R4$ always have the opposite signs, numerators in the thermals do not cancel out each other and increase or decrease for the following reason. As is evident from FIG. 7, when the current magnetic field Hm in the +Y direction is applied in a state where the bias magnetic field corresponding to a bias point BP1 is applied in advance, the resistance values change (substantially, decrease) only by the change amounts $\Delta R2$ and $\Delta R4$ (where $\Delta R2 < 0$, $\Delta R4 < 0$) in the magnetoresistive elements 22 and 24. On the other hand, the resistance values change (substantially, increase) only by the change amounts $\Delta R1$ and $\Delta R3$ (where $\Delta R1 > 0$, $\Delta R3 > 0$) in the magnetoresistive elements 21 and 23.

When it is assumed that the magnetoresistive elements 21 to 24 have the completely same characteristics, that is, when $$R = R1 = R2 = R3 = R4 \text{ and}$$

$$\Delta R = \Delta R1 = -\Delta R2 = \Delta R3 = -\Delta R4$$

The equation (8) is calculated as follows.

$$V0 = \{(R+\Delta R)/(2R) - (R-(R-\Delta R)/(2R)\} \cdot V$$
$$= (\Delta R/R) \cdot V$$

As described above, by using the magnetoresistive elements 21 to 24 whose characteristic values such as the resistance change ratio $\Delta R/R$ are grasped in advance, the magnitude of the current magnetic field Hm can be computed, and the magnitude of the current Im to be detected that generates the current magnetic field Hm can be estimated. In particular, by constructing a bridge circuit to perform sensing, as compared with the sensing performed by a single element pattern having equal outputs, a larger resistance change amount in the element pattern of each of the magnetoresistive elements can be detected, so that precision of the measurement values can be improved. In the second embodiment, the magnetization directions J11 of the pinned layers 11 in all of the magnetoresistive elements 21 to 24 are the same, so that the magnetization directions J11 form the same angle from the direction of the current magnetic field Hm. Thus, it is relatively easy to suppress variations in the detection sensitivity in the magnetoresistive elements 21 to 24.

Further, in the current sensor 1B, both of the potential V1 detected at the third connection point P3 and the potential V2 detected at the fourth connection point P4 are supplied to the differential amplifier AMP, and the compensating current Id by which the difference (the potential difference V0) becomes zero is output. The compensating current Id from the differential amplifier AMP makes the compensating current magnetic fields Hd in the direction opposite to that of the current magnetic field Hm passed to each of the element patterns 21A to 21C, 22A to 22C, 23A to 23C, and 24A to 24C and acts so as to cancel an error amount caused by variations in the connection resistance in the circuit, variations in the characteristics between the magnetoresistive elements 21 to 24, bias in the temperature distribution, an interference magnetic field from the outside, or the like. As a result, the magnitude of the compensating current Id becomes proportional only to the current magnetic field Hm. Therefore, the compensating current detecting means S can compute the current magnetic field Hm more accurately by measuring the output voltage Vout and calculating the compensating current Id from the relation with the known resistor RL and, accordingly, can estimate the magnitude of the current Im to be detected with high precision.

As described above, the current sensor 1B of the embodiment has the configuration obtained by adding the magnetoresistive elements 23 and 24 to the configuration of the current sensor 1A of the first embodiment. Consequently, sensing can be performed by constructing the bridge circuit, and the precision of measurement values of the current Im to be detected can be increased. In this case, the magnetoresistive element 23 is provided at the same second level L2 as that of the magnetoresistive element 21, and the magnetoresistive element 24 is provided at the same level L3 as that of the magnetoresistive element 22. In addition, the magnetoresistive elements 21 and 23 share the compensating current line 31, and the magnetoresistive elements 22 and 24 share the compensating current line 32. Therefore, the compact configuration can be maintained as a whole.

Figure 12:
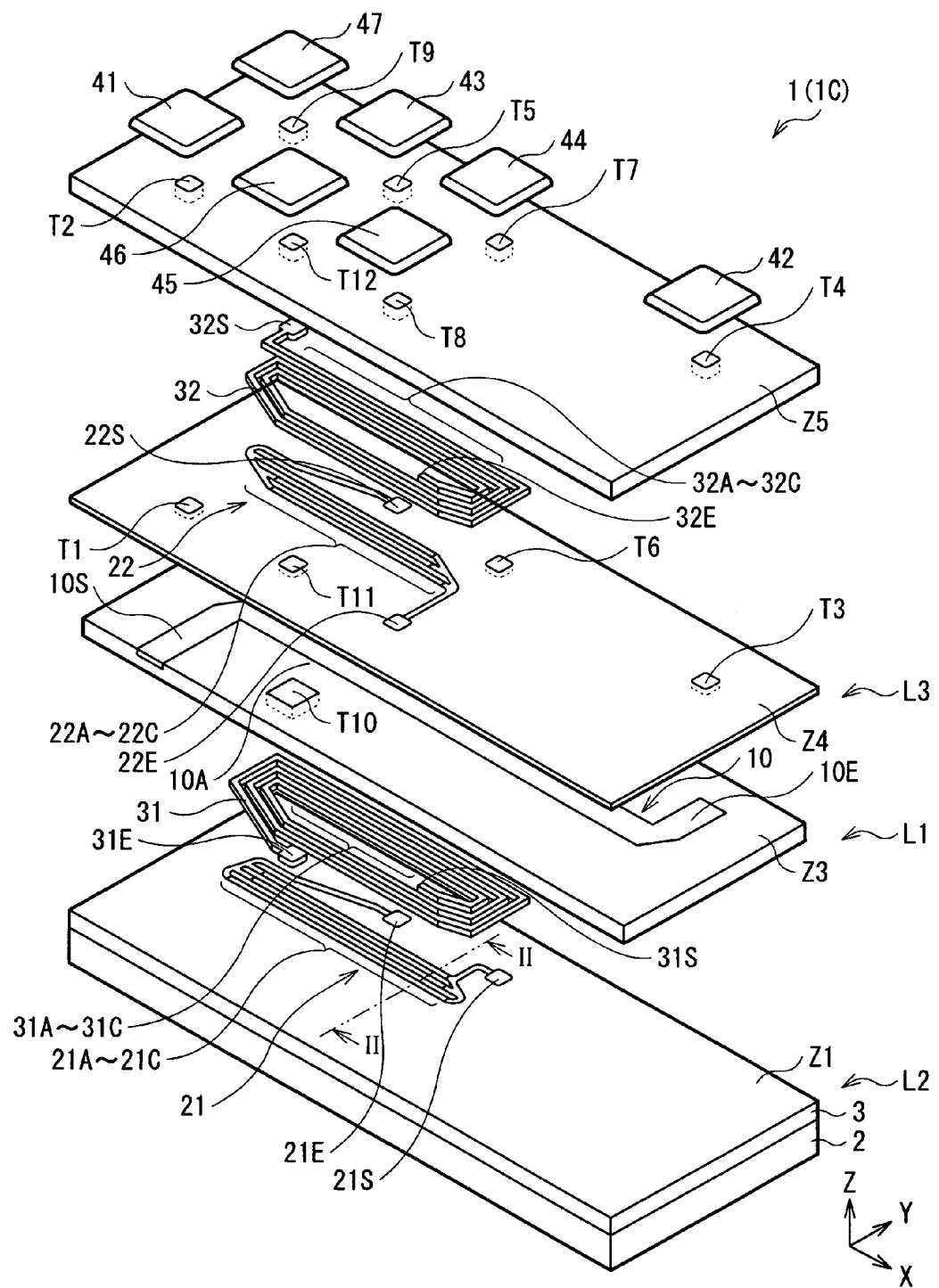
FIG. 12 is a perspective view showing the configuration of a modification of the current sensor according to the first embodiment of the invention.

Although the present invention has been described by the embodiments above, the invention is not limited to the foregoing embodiments but can be variously modified. For example, although the plurality of element patterns in the magnetoresistive element are connected in series in the embodiments, the invention is not limited to the configuration. For example, the element patterns may be connected in parallel as shown in a current sensor 1C as a modification shown in FIG. 12. In this case, while maintaining a compact configuration, the impedance as a whole can be decreased without decreasing the resistance change ratio $\Delta R/R$, the influence by noise from the outside (unnecessary magnetic fields) is reduced, and the S/N ratio can be improved. In this case as well, when the first compensating current line 31 winds in the fourth level L4 so as to include the winding body portions 31A to 31C extending in the first direction in correspondence with the element patterns 21A to 21C in the first magnetoresistive element 21, and the second compensating current line 32 winds in the fifth level L5 so as to include the winding body portions 32A to 32C extending in the first direction in correspondence with the element patterns 22A to 22C in the second magnetoresistive element 22. With the configuration, the compensating current magnetic field Hd of a proper magnitude can be supplied to the element patterns 21A to 21C and the element patterns 22A to 22C, and an advantage such that precision of measurement values of the current Im to be detected further increases is obtained.

In the second embodiment, the first and third magnetoresistive elements share the first compensating current line, and the second and third magnetoresistive elements share the second compensating current line. However, the invention is not limited to the configuration. A third compensating current line corresponding to the third magnetoresistive element may be provided or a fourth compensating current line corresponding to the fourth magnetoresistive element may be provided.

Further, although the element pattern having the spin valve structure in which the magnetization direction of the pinned layer and the direction of the easy axis of magnetization of the free layer coincide with each other is employed in the embodiment, the invention is not limited to the configuration. For example, an element pattern having a spin valve structure in which the magnetization direction of the pinned layer and the easy axis of magnetization of the free layer are orthogonal to each other may be used.

The current sensor of the invention is used to measure a current value itself as described in the foregoing embodiments and can be also applied for an eddy current inspection technique for inspecting a defective in printed wiring and the like. In an example of application, a current sensor is constructed by arranging a number of element patterns on a straight line and senses a change in an eddy current as a change in a magnetic flux.

What is claimed is:

1. A current sensor comprising:
   a conductor which extends in a first direction at a first level and to which a current to be detected is supplied;
   a first magnetoresistive element which extends in the first direction in a region corresponding to the conductor at a second level different from the first level and whose resistance value changes according to a current magnetic field generated by the current to be detected flowing in the conductor; and
   a second magnetoresistive element which extends in the first direction in a region corresponding to the conductor at a third level positioned on a side opposite to the second level with respect to the first level, and whose resistance value changes in a direction opposite to that in the first magnetoresistive element in accordance with the current magnetic field;
   a first compensating current line provided in a region corresponding to the first magnetoresistive element at a fourth level adjacent to the second level, and applying a compensating current magnetic field in the direction opposite to that of a current magnetic field applied to the first magnetoresistive element on the basis of the current to be detected when a compensating current according to the voltage drop difference flows, to the first magnetoresistive element; and
   a second compensating current line provided in a region corresponding to the second magnetoresistive element at a fifth level adjacent to the third level, and applying a compensating current magnetic field in the direction opposite to that of a current magnetic field applied to the second magnetoresistive element on the basis of the current to be detected when a compensating current according to the voltage drop difference flows, to the second magnetoresistive element, wherein the current to be detected is detected on the basis of a difference between voltage drops which occur when constant currents whose values are equal to each other flow to the first and second magnetoresistive elements.

2. The current sensor according to claim 1, wherein each of the first and second magnetoresistive elements has a plurality of element patterns disposed so as to be adjacent to each other in a second direction orthogonal to the first direction and connected in series.

3. The current sensor according to claim 2, wherein:

the first compensating current line winds in the fourth level while including a plurality of winding body portions extending in the first direction in correspondence with the element patterns of the first magnetoresistive elements, and the second compensating current line winds in the fifth level while including a plurality of winding body portions extending in the first direction in correspondence with the element patterns of the second magnetoresistive elements.

4. The current sensor according to claim 2, wherein each of the element patterns in the first and second magnetoresistive elements includes a magnetization pinned film having magnetization pinned in the first direction.

5. The current sensor according to claim 1, wherein each of the first and second magnetoresistive elements has a plurality of element patterns disposed so as to be adjacent to each other in a second direction orthogonal to the first direction and connected in parallel with each other.

6. The current sensor according to claim 5, wherein:

the first compensating current line winds in the fourth level while including a plurality of winding body portions extending in the first direction in correspondence with the element patterns of the first magnetoresistive elements, and the second compensating current line winds in the fifth level while including a plurality of winding body portions extending in the first direction in correspondence with the element patterns of the second magnetoresistive elements.

7. The current sensor according to claim 5, wherein each of the element patterns in the first and second magnetoresistive elements includes a magnetization pinned film having magnetization pinned in the first direction.

8. The current sensor according to claim 1, further comprising:

a third magnetoresistive element which extends in the first direction in a region corresponding to the conductor at the second level, other than the region in which the first magnetoresistive element is formed, and whose resistance value changes in the same direction as that in the first magnetoresistive element in accordance with the current magnetic field; and a fourth magnetoresistive element which extends in the first direction in a region corresponding to the conductor at the third level, other than the region in which the second magnetoresistive element is formed, and whose resistance value changes in the direction opposite to that in the first magnetoresistive element in accordance with the current magnetic field, wherein:

the first compensating current line is provided in a region corresponding to both of the first and third magnetoresistive elements at the fourth level adjacent to the second level, and applying a compensating current magnetic field in the direction opposite to that of a current magnetic field applied to the first and third magnetoresistive elements on the basis of the current to be detected when a compensating current according to the potential difference flows, to the first and third magnetoresistive elements; and the second compensating current line is provided in a region corresponding to both of the second and fourth magnetoresistive elements at the fifth level adjacent to the third level, and applying a compensating current magnetic field in the direction opposite to that of a current magnetic field applied to the second and fourth magnetoresistive elements on the basis of the current to be detected when a compensating current according to the potential difference flows, to the second and fourth magnetoresistive elements.

9. The current sensor according to claim 8, wherein a bridge circuit is constructed in such a manner that;

one end of the first magnetoresistive element and one end of the second magnetoresistive element are connected to each other at a first connection point, one end of the third magnetoresistive element and one end of the fourth magnetoresistive element are connected to each other at a second connection point, the other end of the first magnetoresistive element and the other end of the fourth magnetoresistive element are connected to each other at a third connection point, and the other end of the second magnetoresistive element and the other end of the third magnetoresistive element are connected to each other at a fourth connection point, and on the basis of a potential difference between the third and fourth connection points occurring when a voltage is applied across the first and second connection points, the current to be detected is detected.

10. The current sensor according to claim 8, wherein each of the first to fourth magnetoresistive elements has a plurality of element patterns disposed so as to be adjacent to each other in a second direction orthogonal to the first direction and connected to each other in series.

11. The current sensor according to claim 10, wherein:

the first compensating current line winds in the fourth level while including a plurality of winding body portions extending in the first direction in correspondence with the element patterns of both of the first and third magnetoresistive elements, and the second compensating current line winds in the fifth level while including a plurality of winding body portions extending in the first direction in correspondence with the element patterns of both of the second and fourth magnetoresistive elements.

12. The current sensor according to claim 10, wherein each of the element patterns in the first to fourth magnetoresistive elements includes a magnetization pinned film having magnetization pinned in the first direction.

13. The current sensor according to claim 8, wherein each of the first to fourth magnetoresistive elements has a plurality of element patterns disposed so as to be adjacent to each other in a second direction orthogonal to the first direction and connected in parallel with each other.

14. The current sensor according to claim 13, wherein:

the first compensating current line winds in the fourth level while including a plurality of winding body portions extending in the first direction in correspondence with the element patterns of both of the first and third magnetoresistive elements, and the second compensating current line winds in the fifth level while including a plurality of winding body portions extending in the first direction in correspondence with the element patterns of both of the second and fourth magnetoresistive elements.

15. The current sensor according to claim 13, wherein each of the element patterns in the first to fourth magnetoresistive elements includes a magnetization pinned film having magnetization pinned in the first direction.

* * * * *